United States Patent [19]

Winslow

[11] Patent Number: 5,379,188

[45] Date of Patent: Jan. 3, 1995

[54] ARRANGEMENT FOR MOUNTING AN INTEGRATED CIRCUIT CHIP CARRIER ON A PRINTED CIRCUIT BOARD

[75] Inventor: David W. G. Winslow, Powys, United Kingdom

[73] Assignee: Winslow International Limited, Gwent, United Kingdom

[21] Appl. No.: 55,245

[22] Filed: May 3, 1993

[30] Foreign Application Priority Data

May 8, 1992 [GB] United Kingdom ............. 9209912

[51] Int. Cl.⁶ .............................................. H05K 7/02
[52] U.S. Cl. ..................................... 361/760; 361/728; 361/709; 361/807; 174/52.4; 257/675; 257/690; 439/72; 165/185
[58] Field of Search ............... 361/761, 728, 760, 774, 361/776, 807, 709; 174/52.4, 260, 16.3; 257/661, 686, 675, 690; 439/72; 165/185

[56] References Cited

U.S. PATENT DOCUMENTS

| 3,719,917 | 3/1973 | Fischer et al. |
|---|---|---|
| 4,363,076 | 12/1982 | McIver .................... 361/386 |
| 4,547,031 | 10/1985 | Korsunsky ............. 339/75 M |
| 4,758,176 | 7/1988 | Abe et al. .................. 439/331 |
| 4,768,973 | 9/1988 | Bakermans . |
| 5,020,998 | 6/1991 | Ikeya et al. ............. 439/266 |

FOREIGN PATENT DOCUMENTS

| 66706 | 12/1982 | European Pat. Off. . |
|---|---|---|
| 1488648 | 10/1977 | United Kingdom . |
| 1588527 | 4/1981 | United Kingdom . |
| 2164213 | 3/1986 | United Kingdom . |
| 8500467 | 1/1985 | WIPO . |
| 91/15881 | 10/1991 | WIPO . |

Primary Examiner—Leo P. Ricard
Assistant Examiner—Young Whang
Attorney, Agent, or Firm—Larson & Taylor

[57] ABSTRACT

There is provided a mounting arrangement for an integrated circuit chip carrier 7. The carrier 7 is retained in a holder 5 using the lateral forces created by the interference between leads 12 of the carrier and the walls 17 of the holder 5. A lid 6 is applied to the carrier 5 and leaf springs 3 are disposed in between. The lid 6 clips on to a circuit board 8 by virtue of barbed legs 4 and holes 11. The springs 3 urge the leads 12 against contact pads 9 on the circuit board 8.

7 Claims, 4 Drawing Sheets

ARRANGEMENT FOR MOUNTING AN INTEGRATED CIRCUIT CHIP CARRIER ON A PRINTED CIRCUIT BOARD

The invention relates to a mounting arrangement for an integrated circuit chip carrier. Chip carriers encapsulate integrated circuits in insulating material and provide electrical connections to the circuit by a number of protruding leads. Large scale integration requires a corresponding high number of leads. To achieve the optimum switching speeds these leads must be kept as small as possible which means minimising the size of the carrier. For example, one kind of chip carrier in use at present is a "Quad Flat Pack" (QFP) which may have more than 250 leads protruding from its periphery with a pitch spacing as little as 0.3 mm.

While it is possible to mount carriers such as QFP's by machine soldering the leads to pads on a printed circuit board this is a permanent mounting and the carrier cannot be removed and reused. This is a serious disadvantage for small production runs where the cost of automatic soldering equipment is not justified or in research and development when the carriers may need to be resited in modified circuit boards. To overcome this difficulty it has been proposed to use sockets which have leads soldered to the circuit board and which accept chip carriers in a removable plug-in fashion. A difficulty with this arrangement is that the socket leads introduce capacitance and inductance which effectively slow the operation of the chip devices. The present invention seeks to provide a solution.

According to the invention there is provided a mounting arrangement for an integrated circuit chip carrier, the chip carrier having an essentially flat insulating body with a top and a bottom and a number of conductive leads which project outwardly and downwardly from the periphery of the body, the mounting arrangement comprising a holder adapted to accept the leads of the chip carrier as a tight fit and a spring clamp arrangement which resiiliently clamps the holder and the chip carrier to a printed circuit board so that the leads make contact with respective contact pads on the board, the holder having a shaped rim which is adapted to the shape of the leads to press them into contact with the pads.

In order to locate the leads and ensure that they do not touch it is preferred that the holder has a peripheral wall with inwardly projecting ribs which locate between adjacent leads.

Preferably the holder has protruding location pins which locate in respective holes in the circuit board.

The spring clamp arrangement may comprise a lid which accepts the holder and which is removably mounted on the board by way of legs with barb-like terminations which pass through and are retained by holes in the board. Preferably springs act between the lid and the holder to tend to urge them apart.

The invention will further be described with reference to the accompanying drawings, of which:

Figure 1:
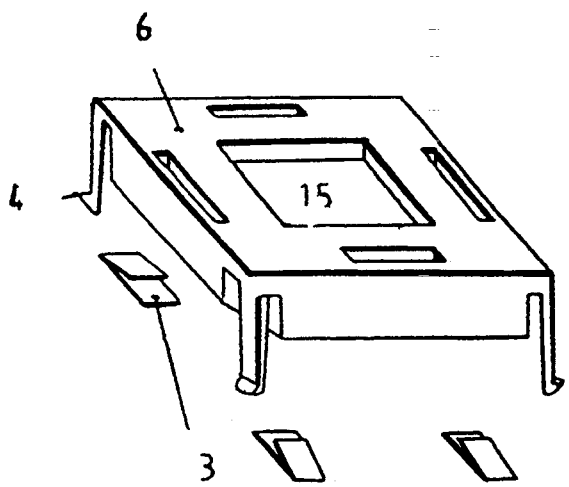
FIG. 1 is an exploded view illustrating a chip carrier mounting arrangement in accordance with the invention.
Figure 1:
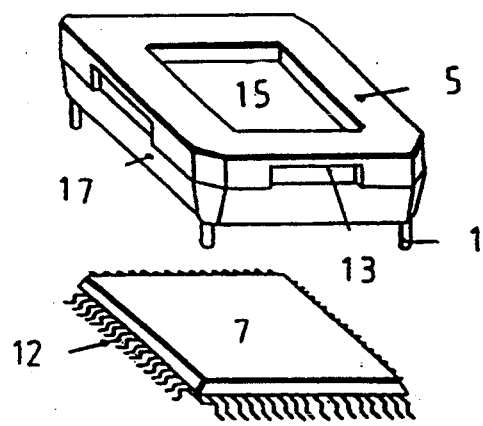
Figure 1:
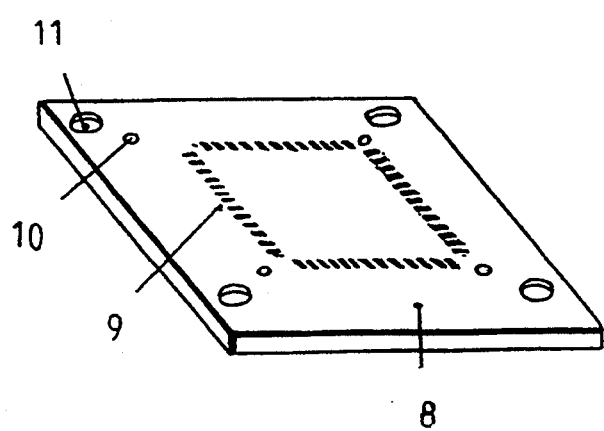

Referring to FIG. 1 there is shown an integrated circuit chip carrier 7 of the Quad Flat Pack (QFP) kind. The chip carrier is an essentially flat insulating pack having a top face and a bottom face and a number of conductive leads 12 which project outwardly and downwardly from the periphery of the pack. In this example the pack has 256 leads with a pitch spacing of 0.3 mm. The pack is to be mounted on a printed circuit board 8 which has a pattern of conductive pads 9, one for each lead 12.

The mounting arrangement comprises a plastics holder 5 which has four walls 17 which define an enclosure within which the QFP is inserted and retained using the lateral forces created from the interference between the IC leads and the side walls. Next, a plastics lid 6 is fitted over the holder 5. The walls of the holder have recesses 13 into which fit spring clips 14 of the lid. Between the lid and the holder four metal leaf springs 3 are accommodated. These tend to urge the lid and the holder apart, subject to the limiting retention afforded by the clips 14 in the recesses 13.

The assembly is then applied to the printed circuit board and is held in place by four legs 4 which depend from the lid and which have barb-like terminations. The legs are passed through holes 11 in the printed circuit board and the terminations engage the underside of the board to retain the assembly. In order to ensure accurate location of the holder and thus the chip carrier with respect to the pads 9 there are provided four pins 1 in the holder which are located in four holes 10 in the board.

Figure 2:
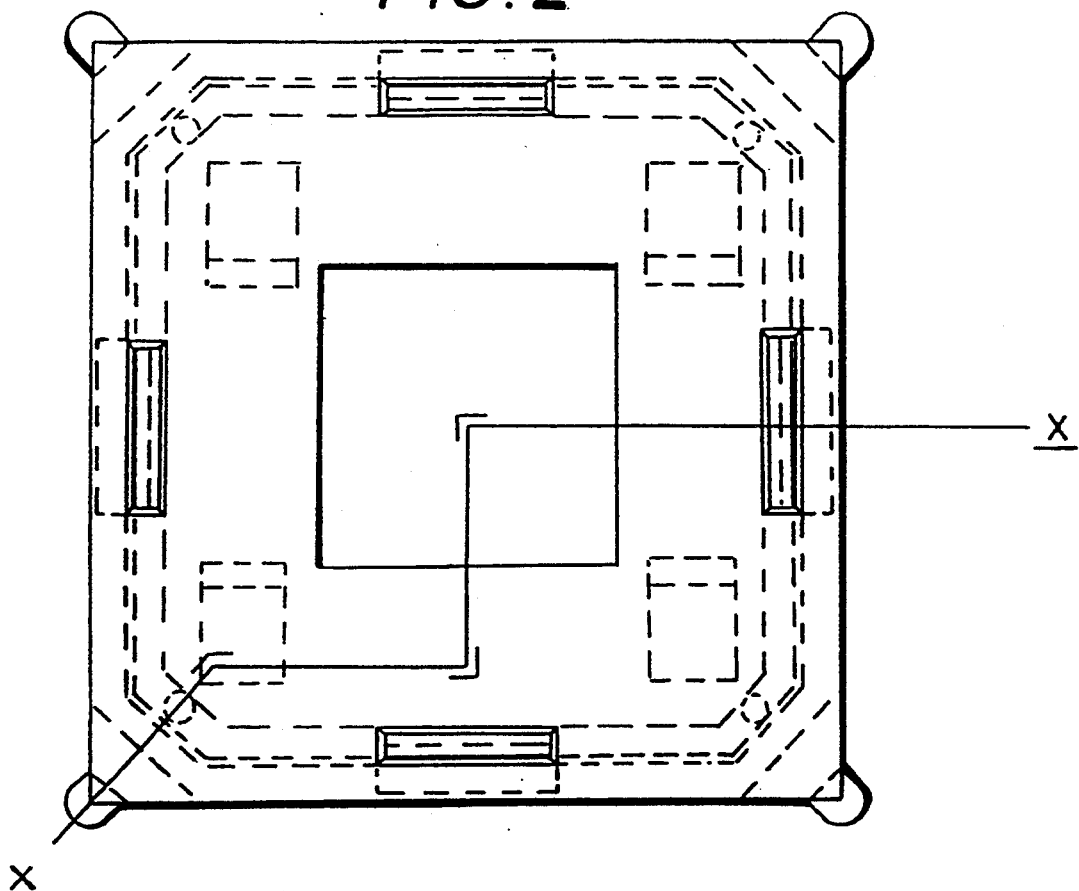
FIG. 2 is a plan view of the arrangement of FIG. 1.
Figure 3:
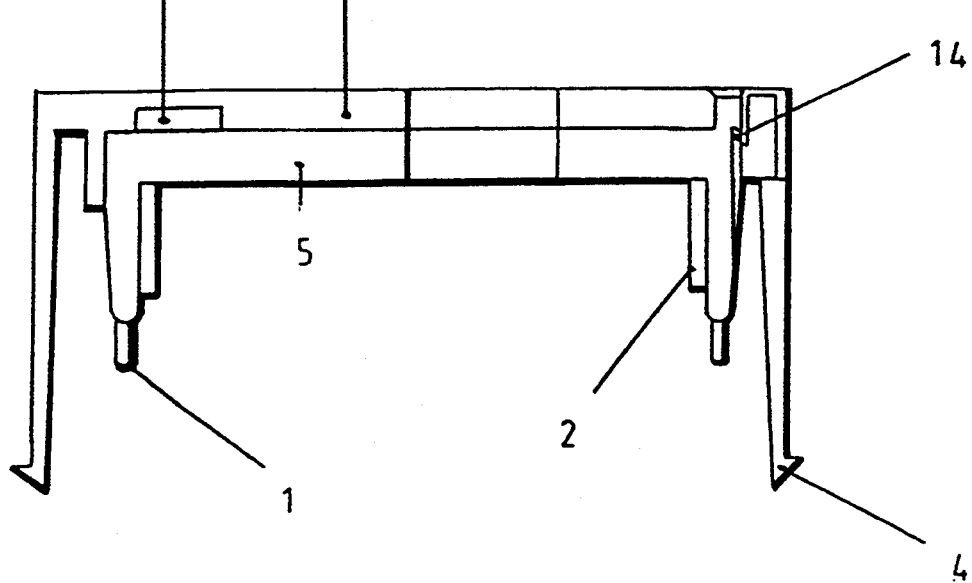
FIG. 3 is a cross-sectional view taken at 'x—x' of FIG. 2.

FIGS. 2 and 3 of the drawings are respectively a plan view and a cross-sectional view (at 'x—x' of FIG. 2) and show the elements described above.

Figure 4:
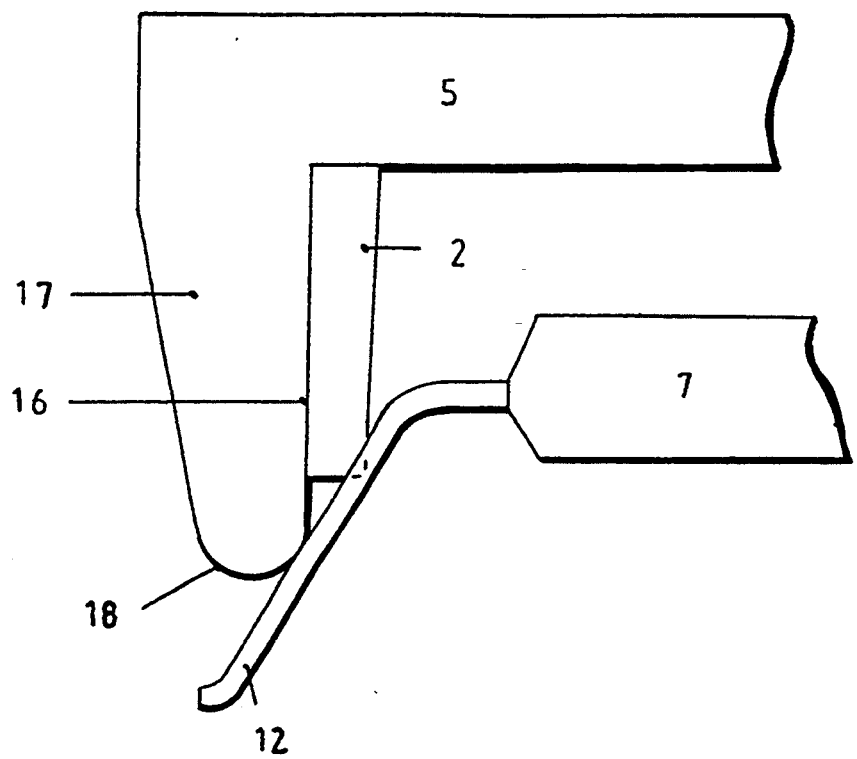
FIG. 4 is a detail view of part of the arrangement of FIGS. 1 to 3 before mounting the chip carrier.
Figure 5:
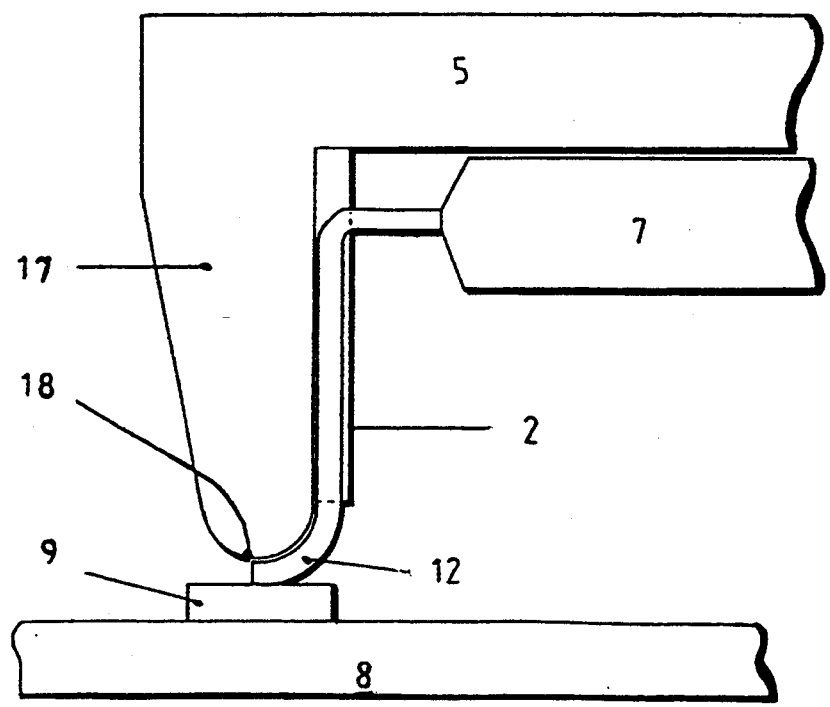
FIG. 5 is a detail view corresponding to FIG. 4 with the chip carrier mounted.

FIG. 4 is a diagram of part of the wall 17 of the holder 5 and its relation to the carrier 7 as the carrier is about to be inserted. It will be seen that the pins 12 project downwardly at an angle which is typically 10° to the vertical. As the carrier is pushed home in the holder to the position shown in FIG. 5 the legs are bent to the vertical against the inside of the wall 14. The lateral forces produced by this action retain the QFP in position. The rim 18 of the wall is shaped to accommodate the curvature of the ends of the pins so that the spring pressure of the springs 3 clamps the leads against the pads 9 as shown in FIG. 5.

In order to ensure that the leads 12 do not touch each other the walls 17 are provided with vertical ribs 2 which project between adjacent leads.

It will be seen that with the arrangement described a chip carrier may be removably mounted on a printed circuit board without introducing extra leads. The assembly may be removed from the board by disengaging the legs 4 and the chip carrier may be removed from the holder if required by pushing via an aperture 15.

Figure 6:
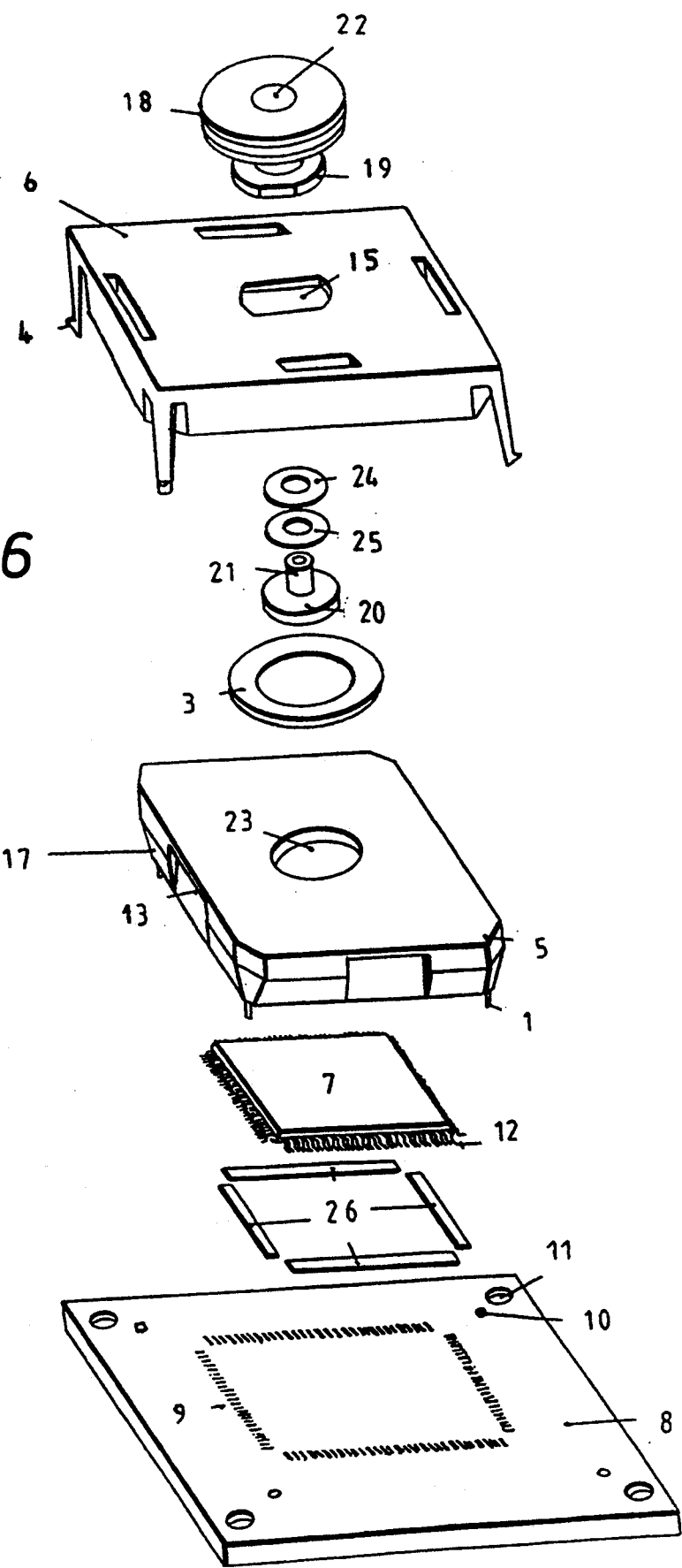
FIG. 6 is an exploded view illustrating a modified chip carrier mounting arrangement in accordance with the present invention.

With the arrangement shown in FIG. 6 a heat sink 28 is incorporated, the lower end 19 fitting through the aperture 15 in the lid 6. A plunger 20 having a stem 21 is provided for screw fitting into a hole 22 in the heat sink 18 after the stem 21 passes through the hole 23 in the holder 5. Springs 24 and 25 are disposed between the enlarged end of the plunger 20 and the heat sink 18.

The four leaf springs of the previous embodiment have also been replaced by an annular leaf spring 3.

At this stage the plunger end does not contact the surface of the carrier 7. When the mounting arrangement is fully assembled and locked on to the circuit board then the heat sink 18 is pressed downwards and is twisted through 90°. The lower end 19 is such that the heat sink is thus locked into the lowered position with the enlarged end of the plunger 20 applying pressure to the surface of the chip carrier 7. This action together with the action of the spring 3 ensures the necessary pressure to produce the gas tight seal between the pads 9 and the leads 12.

In order to guarantee a gas tight seal in the above embodiments, strips of electrically conductive tape 26 may be adhered to the pads 9 so as to be sandwiched between the pads 9 and the conductive leads 12.

I claim:

1. A mounting for an integrated circuit chip carrier comprising, in combination, a chip carrier having an flat insulating body with top and bottom surfaces, a plurality of conductive leads projecting outwardly and downwardly from a periphery of the body, a holder having a shaped rim to receive the chip carrier to provide a tight fit within the holder for retaining the chip carrier in the holder prior to insertion on a printed circuit board having a plurality of conductive pads on an upper surface of the circuit board, and means for clamping the holder and the chip carrier onto the printed circuit board so that the conductive leads extending below a bottom surface of the chip carrier are pressed by the shaped rim of the holder into direct contact with the conductive pads on the upper surface of the circuit board.

2. A mounting arrangement as claimed in claim 1 wherein the holder has a peripheral wall with inwardly projecting ribs which locate between adjacent leads.

3. A mounting arrangement as claimed in claim 1 wherein the holder has protruding location pins which locate in respective holes in the circuit board.

4. A mounting arrangement as claimed in claim 1 wherein the clamping means comprises springs acting between a lid and the holder to tend to urge them apart.

5. A mounting arrangement as claimed in claim 1, wherein the clamping means comprises a lid which receives the holder and is removably mounted on the printed circuit board by legs with barb-like terminations which pass through and are retained by holes in the printed circuit board.

6. A mounting arrangement as claimed in claim 5 and further including a heat sink mounted on the lid.

7. A mounting arrangement as claimed in claim 6 wherein the heat sink has a first position in which it does not contact the chip carrier and a second position in which it applies pressure to the carrier in the direction of the printed circuit board.

* * * * *